United States Patent
Lee et al.

(10) Patent No.: US 8,427,869 B2
(45) Date of Patent: Apr. 23, 2013

(54) VOLTAGE SWITCH CIRCUIT AND NONVOLATILE MEMORY DEVICE USING THE SAME

(75) Inventors: Jae Ho Lee, Gyeonggi-do (KR); Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 240 days.

(21) Appl. No.: 12/982,468

(22) Filed: Dec. 30, 2010

(65) Prior Publication Data
US 2012/0008391 A1 Jan. 12, 2012

(30) Foreign Application Priority Data
Jul. 9, 2010 (KR) .................. 10-2010-0066486

(51) Int. Cl.
G11C 16/08 (2006.01)
H03K 17/687 (2006.01)

(52) U.S. Cl.
USPC .................. 365/185.05; 365/185.18; 327/427

(58) Field of Classification Search .................. None
See application file for complete search history.

(56) References Cited

U.S. PATENT DOCUMENTS

| | | | |
|---|---|---|---|
| 6,097,665 A * | 8/2000 | Tomishima et al. | 365/230.06 |
| 6,104,665 A * | 8/2000 | Hung et al. | 365/230.06 |
| 6,807,103 B2 | 10/2004 | Cavaleri et al. | |
| 2007/0222498 A1* | 9/2007 | Choy et al. | 327/536 |
| 2008/0144376 A1* | 6/2008 | Lee | 365/185.05 |

FOREIGN PATENT DOCUMENTS
KR 1020090124103 12/2009

OTHER PUBLICATIONS

Notice of Preliminary Rejection issued from Korean Intellectual Property Office on Sep. 30, 2011.

* cited by examiner

Primary Examiner — Hoai V Ho
Assistant Examiner — James G Norman
(74) Attorney, Agent, or Firm — IP & T Group LLP (57) ABSTRACT

A voltage switch circuit includes a positive voltage supply circuit configured to supply a positive voltage to a control node in response to an enable signal, a negative voltage supply circuit configured to supply a negative voltage to the control node in response to a negative voltage enable signal, a control signal generation circuit configured to generate the negative voltage enable signal in response to the enable signal, and a switch circuit configured to transfer an input voltage with a positive potential or a negative potential to an output node in response to a potential of the control node.

20 Claims, 6 Drawing Sheets

VOLTAGE SWITCH CIRCUIT AND NONVOLATILE MEMORY DEVICE USING THE SAME

CROSS-REFERENCE TO RELATED APPLICATION

Priority to Korean patent application number 10-2010-0066486 filed on Jul. 9, 2010, the entire disclosure of which is incorporated by reference herein, is claimed.

BACKGROUND

Exemplary embodiments relate to a voltage switch circuit and a nonvolatile memory device using the same and, more particularly, to a nonvolatile memory device using a voltage switch circuit which can transfer a negative voltage and a positive voltage to the word lines of a memory cell block.

There has been an increasing demand for semiconductor memory devices which can be electrically programmed and erased and yet do not require the refresh function of rewriting data at specific intervals. In manufacturing high-capacity memory devices capable of storing large data, memory devices adapted for high integration such as flash memories are useful.

Here, flash memory devices are mainly divided into NAND type flash memory devices and NOR type flash memory devices. NOR type flash memory devices have benefits such as superior random access time characteristics due to the memory cells being independently coupled to bit lines and word lines. NAND type flash memory devices have benefits such as enablement of high degree of integration where a plurality of memory cells may be coupled together in series and use only one contact for every cell string. Accordingly, NAND type flash memory is often used in high-integration nonvolatile memory devices.

With respect to NAND type flash memory devices, margins between threshold voltage distributions of memory cells may be improved by a fine control of the threshold voltage distributions including those in a negative voltage region. In order to accurately control threshold voltage distributions in the negative region, a negative voltage lower than 0 V is to be used as a verification voltage.

A NAND type flash memory device may use a block selection circuit for selecting a memory cell array on a block by block basis in order to perform the program, read, and erase operations of memory cells. However, a conventional block selection circuit may only be able to transfer a positive voltage, and not a negative voltage, to a selected memory cell array. Accordingly, the threshold voltage distributions of memory cells of the selected memory cell array are limited to a positive region. In multi-level cells having a plurality of threshold voltage distributions, such an arrangement of threshold voltage distributions reduces margins between the threshold voltage distributions.

BRIEF SUMMARY

Exemplary embodiments relate to a voltage switch circuit capable of switching a high voltage and a negative voltage using a triple well high voltage transistor and a nonvolatile memory device for supplying a high voltage and a negative voltage to the word line of a selected memory cell block using the same.

A voltage switch circuit according to an exemplary aspect of this disclosure includes a positive voltage supply circuit configured to supply a positive voltage to a control node in response to an enable signal, a negative voltage supply circuit configured to supply a negative voltage to the control node in response to a negative voltage enable signal, a control signal generation circuit configured to generate the negative voltage enable signal in response to the enable signal, and a switch circuit configured to transfer an input voltage with a positive potential or a negative potential to an output node in response to a potential of the control node.

A voltage switch circuit according to another exemplary aspect of this disclosure includes a memory cell block, a block decoder circuit configured to output a block selection signal having a logic high with a positive voltage and having a logic low with a negative voltage and select the memory cell block in response to a block enable signal, and an operating voltage transmission unit configured to transfer an operating voltage to the memory cell block in response to the block selection signal.

The block decoder circuit may include a block address decoder configured to output an enable signal in response to the block enable signal when an inputted address signal matches an address for the memory cell block, a positive voltage supply circuit configured to supply the positive voltage to a control node in response to the enable signal, a negative voltage supply circuit configured to supply the negative voltage to the control node in response to a negative voltage enable signal, and a control signal generation circuit configured to generate the negative voltage enable signal in response to the enable signal.

DESCRIPTION OF EMBODIMENTS

Hereinafter, exemplary embodiments of this disclosure are described in detail with reference to the accompanying drawings. The figures are provided to enable those of ordinary skill in the art to make and use the exemplary embodiments of the disclosure.

Figure 1:
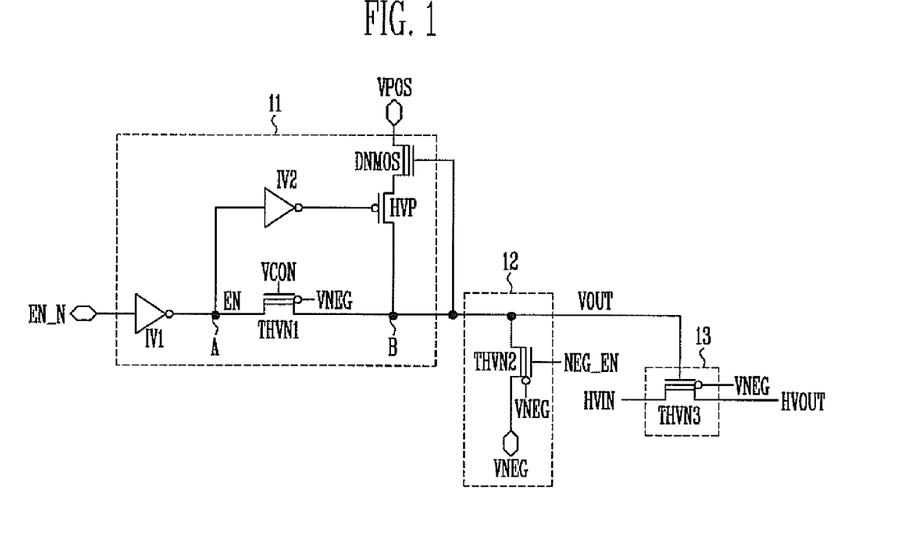
FIG. 1 is a circuit diagram of a voltage switch circuit according to an exemplary embodiment of this disclosure.

FIG. 1 is a circuit diagram of a voltage switch circuit according to an exemplary embodiment of this disclosure.

Referring to FIG. 1, the voltage switch circuit includes a high/positive voltage supply circuit 11, a negative voltage supply circuit 12, and a switch circuit 13.

The high voltage supply circuit 11 includes a plurality of inverters IV1 and IV2, a triple well high voltage transistor THVN1, a depletion NMOS transistor DNMOS, and a high voltage PMOS transistor HVP. The inverter IV1 outputs an inverse enable signal EN, which is an inverse signal of an enable signal EN_N, to node A. The inverter IV2 inverts the inverse enable signal EN and outputs it to the gate of the high voltage PMOS transistor HVP. The depletion NMOS transistor DNMOS and the high voltage PMOS transistor HVP are coupled in series between a high voltage terminal VPOS and output node B. The gate of the depletion NMOS transistor DNMOS is coupled to output node B, and the gate of the high voltage PMOS transistor HVP is coupled to the output node of the inverter IV2. The triple well high voltage transistor THVN1 is coupled between node A and output node B and configured to send the inverse enable signal EN to output node B in response to a control signal VCON. The control signal VCON is an inverted signal of the enable signal EN_N or a signal having a negative voltage potential when the enable signal EN_N of a high level is supplied.

For example, when the enable signal EN_N of a low level and the control signal VCON of a high level are received, the triple well high voltage transistor THVN1 transfers the inverse enable signal EN of a high level to output node B in response to the control signal VCON of a high level. Thus, the potential of output node B rises by the logic level of the inverse enable signal EN, and the depletion NMOS transistor DNMOS transfers the high voltage VPOS to the high voltage PMOS transistor HVP in response to the potential of output node B. The high voltage PMOS transistor HVP is turned on in response to the output signal of a low level output by the inverter IV2, thus supplying the high voltage VPOS to output node B. Accordingly, the potential of output node B further rises. Consequently, the amount of current flowing through the depletion NMOS transistor DNMOS is further increased in response to the potential increase at output node B and thus the potential of output node B rises to the high voltage (VPOS) level.

The negative voltage supply circuit 12 supplies a negative voltage VNEG to output node B in response to a negative voltage enable signal NEG_EN.

The negative voltage supply circuit 12 can include a triple well high voltage transistor THVN2. The triple well high voltage transistor THVN2 is coupled between output node B and a negative voltage terminal VNEG and is configured to send the negative voltage VNEG to output node B in response to the negative voltage enable signal NEG_EN.

When the negative voltage VNEG is supplied to output node B, the triple well high voltage transistor THVN1 of the high voltage supply circuit 11 can prevent the negative voltage VNEG of output node B from being coupled to the inverter IV1 and thus prevent any possible damage to the inverter IV1.

The switch circuit 13 transfers an input voltage HVIN to an output voltage HVOUT in response to the potential of output node B. The switch circuit 13 can include a triple well high voltage transistor THVN3. The triple well high voltage transistor THVN3 transfers the input voltage HVIN to the output voltage HVOUT in response to the output signal VOUT of output node B supplied to a gate.

Figure 2:
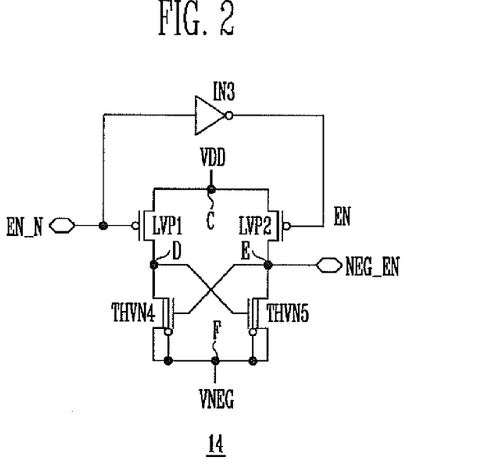
FIG. 2 is a circuit diagram of a control signal generation circuit according to an exemplary embodiment of this disclosure.

FIG. 2 is a circuit diagram of a control signal generation circuit 14 for generating the negative voltage enable signal NEG_EN according to an exemplary embodiment of this disclosure.

Referring to FIG. 2, the control signal generation circuit 14 includes an inverter IV3, low voltage PMOS transistors LVP1 and LVP2, and triple well high voltage transistors THVN4 and THVN5. The inverter IV3 generates the inverse enable signal EN by inverting the enable signal EN_N of FIG. 1. The low voltage PMOS transistor LVP1 is coupled between node D and node C to which a power supply voltage VDD is supplied. The low voltage PMOS transistor LVP2 is coupled between node E and node C. The low voltage PMOS transistor LVP1 transfers the power supply voltage VDD as received from node C to node D in response to the enable signal EN_N. The low voltage PMOS transistor LVP2 transfers the power supply voltage VDD as received from node C to node E in response to the inverse enable signal EN output by the inverter IV3. The potential of node E is output as the negative voltage enable signal NEG_EN. The triple well high voltage transistor THVN4 is coupled between node D and node F, where the negative voltage VNEG is supplied to node F. The triple well high voltage transistor THVN5 is coupled between node E and node F to which the negative voltage VNEG is supplied. The triple well high voltage transistor THVN4 supplies the negative voltage VNEG to node D in response to a potential of node E. The triple well high voltage transistor TWHVN5 supplies the negative voltage VNEG to node E in response to a potential of node D.

For example, when the enable signal EN_N of a low level is received, the low voltage PMOS transistor LVP1 is turned on and thus the power supply voltage VDD is supplied to node D. Accordingly, the triple well high voltage transistor THVN5 is turned on, the negative voltage VNEG is supplied to node E, and thus the negative voltage enable signal NEG_EN having a negative potential is output.

On the other hand, when the enable signal EN_N of a high level is received, the low voltage PMOS transistor LVP2 is turned on and thus the power supply voltage VDD is supplied to node E. Accordingly, the negative voltage enable signal NEG_EN having the power supply voltage (VDD) level is output.

Referring to FIGS. 1 and 2, when the enable signal EN_N of a low level is inputted to the voltage switch circuit, the high voltage supply circuit 11 supplies the high voltage VPOS to output node B in response to the enable signal EN_N, and the negative voltage supply circuit 12 is disabled in response to the negative voltage enable signal NEG_EN having a negative potential. However, when the enable signal EN_N of a high level is inputted to the voltage switch circuit, the high voltage supply circuit 11 is disabled in response to the enable signal EN_N, and the negative voltage supply circuit 12 supplies the negative voltage VNEG to output node B in response to the negative voltage enable signal NEG_EN having the power supply voltage (VDD) level.

Thus, a potential of output node B becomes the high voltage VPOS or the negative voltage VNEG according to the enable signal EN_N of a low level and the negative voltage enable signal NEG_EN. Accordingly, the switch circuit 13 can switch in response to the high voltage or the negative voltage.

Figure 3:
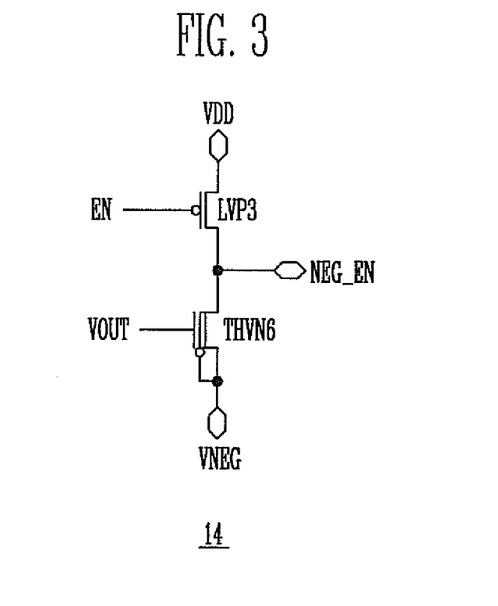
FIG. 3 is a circuit diagram of a control signal generation circuit according to another exemplary embodiment of this disclosure.

FIG. 3 is a circuit diagram of the control signal generation circuit 14 for generating the negative voltage enable signal NEG_EN according to another exemplary embodiment of this disclosure.

Referring to FIG. 3, the control signal generation circuit 14 includes a low voltage PMOS transistor LVP3 and a triple well high voltage transistor THVN6. The low voltage PMOS transistor LVP3 and the triple well high voltage transistor THVN6 are coupled in series between a power supply voltage terminal VDD and a negative voltage terminal VNEG, where a potential of an output node between the low voltage PMOS transistor LVP3 and the triple well high voltage transistor THVN6 is output as the negative voltage enable signal NEG_EN. The low voltage PMOS transistor LVP3 supplies the power supply voltage VDD to the output node in response to the output signal (i.e., the inverse enable signal EN) of the inverter IV1 of the high voltage supply circuit 11 shown in FIG. 1. The triple well high voltage transistor THVN6 supplies the negative voltage VNEG to the output node in response to the output signal VOUT of output node B shown in FIG. 1.

Thus, when the inverse enable signal EN of a high level is received, the control signal generation circuit outputs the negative voltage enable signal NEG_EN having the same potential as the negative voltage VNEG because the output signal VOUT of output node B has a high level. However, when the inverse enable signal EN of a low level is received, the control signal generation circuit 14 outputs the negative voltage enable signal NEG_EN having the same potential as the power supply voltage VDD since the triple well high voltage transistor THVN6 is turned on in response to the output signal VOUT of output node B having a low level.

Figure 4:
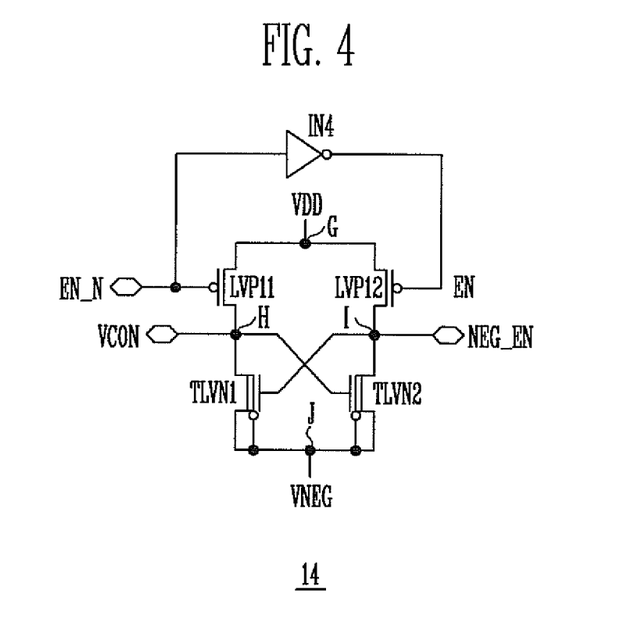
FIG. 4 is a circuit diagram of a control signal generation circuit according to yet another exemplary embodiment of this disclosure.

FIG. 4 is a circuit diagram of the control signal generation circuit according to yet another exemplary embodiment of this disclosure.

Referring to FIG. 4, the control signal generation circuit 14 includes an inverter IV4, low voltage PMOS transistors LVP11 and LVP12, and triple well low voltage transistors TLVN1 and TLVN2. The inverter IV4 receives the enable signal EN_N shown in FIG. 1 and generates the inverse enable signal EN. The low voltage PMOS transistor LVP11 is coupled between node H and node G to which the power supply voltage VDD is supplied. The low voltage PMOS transistor LVP12 is coupled between node G and node I. The low voltage PMOS transistor LVP11 supplies the power supply voltage VDD received through node G to node H in response to the enable signal EN_N. A potential of node H is output as the control signal VCON. The low voltage PMOS transistor LVP12 transfers the power supply voltage VDD received through node G to node I in response to the inverse enable signal EN output by the inverter IV4. A potential of node I is output as the negative voltage enable signal NEG_EN. The triple well low voltage transistor TLVN1 is coupled between the H and node J, where the negative voltage VNEG is supplied to node J. The triple well low voltage transistor TLVN2 is coupled between node I and node J. The triple well low voltage transistor TLVN1 supplies the negative voltage VNEG to node H in response to the potential of node I. The triple well low voltage transistor THVN2 supplies the negative voltage VNEG to node I in response to the potential of node H.

Thus, when the enable signal EN_N of a low level is received, the control signal generation circuit 14 outputs the negative voltage enable signal NEG_EN having the same potential as the negative voltage VNEG, and the control signal VCON having the same potential as the power supply voltage VDD. On the other hand, when the enable signal EN_N of a high level is received, the control signal generation circuit 14 outputs the negative voltage enable signal NEG_EN having the same potential as the power supply voltage VDD, and the control signal VCON having the same potential as the negative voltage VNEG.

Figure 5:
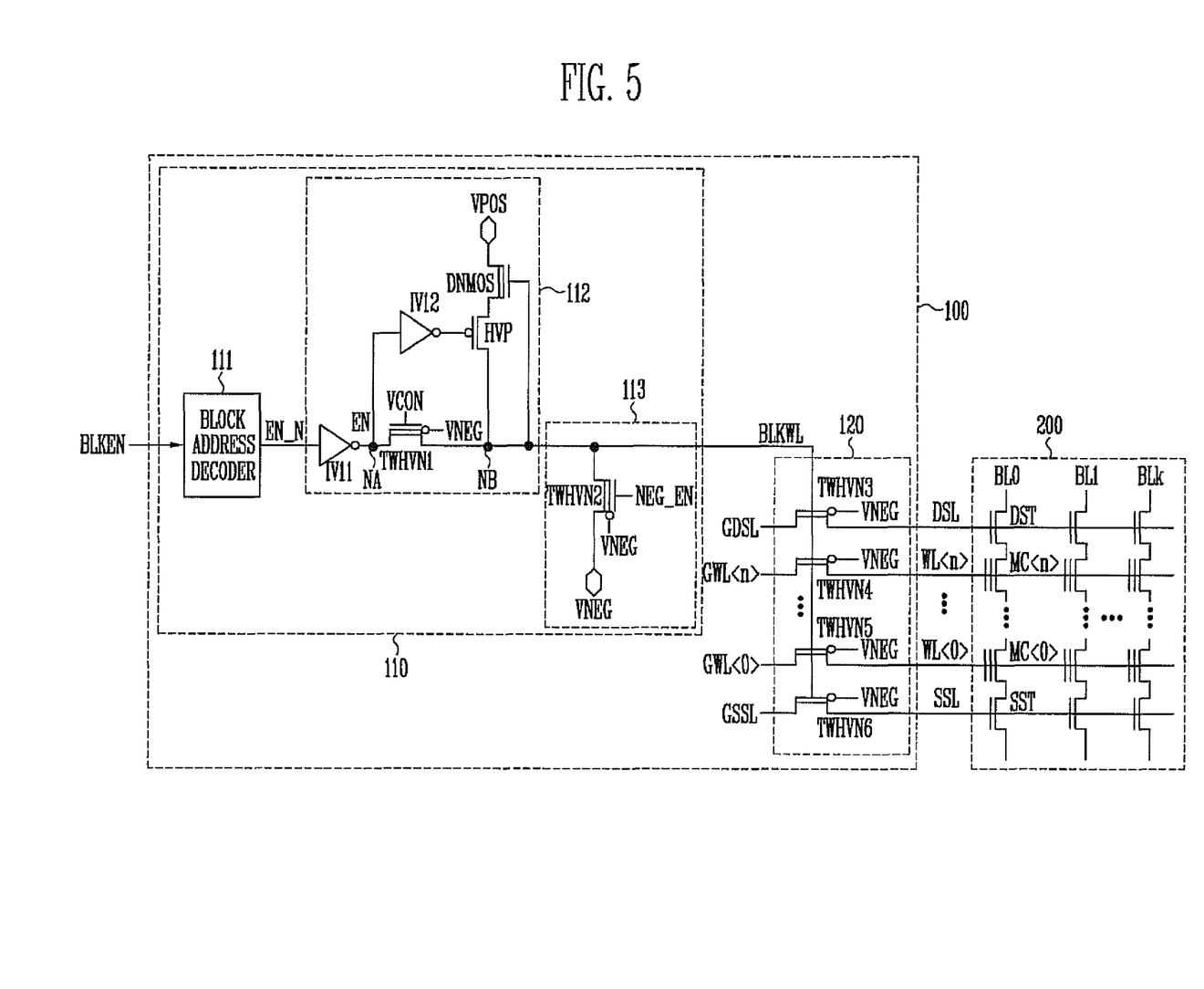
FIG. 5 is a circuit diagram of a nonvolatile memory device using a voltage switch circuit of this disclosure.

FIG. 5 is a circuit diagram of a nonvolatile memory device using the voltage switch circuit of this disclosure.

Referring to FIG. 5, the nonvolatile memory device includes a block selection circuit 100 and a memory cell block 200. The block selection circuit 100 includes a block decoder circuit 110 and an operating voltage transmission unit 120.

The block decoder circuit 110 includes a block address decoder 111, a high voltage supply circuit 112, and a negative voltage supply circuit 113.

The block address decoder 111 outputs an enable signal EN_N in response to a block enable signal BLKEN. The block enable signal BLKEN is enabled when input address signals match addresses of the memory cell block 200 assigned to the block selection circuit 100. For example, the block address decoder 111 can output the enable signal EN_N of a low level when input address signals match addresses of the memory cell block 200 assigned to the block selection circuit 100 and output the enable signal EN_N of a high level when the input address signals do not match addresses of the memory cell block 200 assigned to the block selection circuit 100.

The high voltage supply circuit 112 includes a plurality of inverters IV11 and IV12, a triple well high voltage transistor TWHVN1, a depletion NMOS transistor DNMOS, and a high voltage PMOS transistor HVP. The inverter IV11 receives the enable signal EN_N from the block address decoder 111 and outputs an inverse enable signal EN to node NA. The inverter IV12 inverts the inverse enable signal EN and outputs the inverted signal to the gate of the high voltage PMOS transistor HVP. The depletion NMOS transistor DNMOS and the high voltage PMOS transistor HVP are coupled in series between a high voltage terminal VPOS and output node NB. The gate of the depletion NMOS transistor DNMOS is coupled to output node NB. The gate of the high voltage PMOS transistor HVP is coupled to the output node of the inverter IV12. The triple well high voltage transistor TWHVN1 is coupled between node NA and output node NB and configured to transfer the inverse enable signal EN to output node NB in response to a control signal VCON.

For example, when the enable signal EN_N of a low level and the control signal VCON of a high level are received, the triple well high voltage transistor TWHVN1 transfers the inverse enable signal EN of a high level to output node NB in response to the control signal VCON of a high level. Accordingly, a potential of output node NB rises by a logic level of the inverse enable signal EN, and the depletion NMOS transistor DNMOS transfers the high voltage VPOS to the high voltage PMOS transistor HVP in response to the potential of output node NB. The high voltage PMOS transistor HVP is turned on in response to the output signal of a low level output by the inverter IV12, thus supplying the high voltage VPOS to output node NB. Accordingly, the potential of the output node NB further rises. Consequently, the amount of current flowing through the depletion NMOS transistor DNMOS is further increased, and thus output node NB rises to the high voltage (VPOS) level.

The negative voltage supply circuit 113 supplies a negative voltage VNEG to output node NB in response to a negative voltage enable signal NEG_EN such that a block selection signal BLKWL has the same potential as the negative voltage VNEG when negative voltage VNEG is being supplied by the negative voltage supply circuit 113.

The negative voltage supply circuit 113 can include a triple well high voltage transistor TWHVN2. The triple well high voltage transistor TWHVN2 is coupled between output node NB and the negative voltage terminal VNEG and configured to send the negative voltage VNEG to output node B in response to the negative voltage enable signal NEG_EN.

For example, when the negative voltage VNEG is supplied to output node NB, the triple well high voltage transistor TWHVN1 of the high voltage supply circuit 112 can prevent the negative voltage VNEG of output node NB from being coupled to the inverter IV11 and thereby prevent any possible damage to the inverter IV11.

The operating voltage transmission unit 120 couples a global drain selection line GDSL to the drain selection line DSL of the memory cell block 200, couples a plurality of global word lines GWL<0> to GWL<n> to the plurality of word lines WL<0> to WL<n> of the memory cell block 200, and couples the global source selection line GSSL to the source selection line SSL of the memory cell block 200 in response to the block selection signal BLKWL of the block decoder 110.

The operating voltage transmission unit 120 includes a plurality of triple well high voltage transistors TWHVN3 to TWHVN6. The plurality of triple well high voltage transistors TWHVN3 to TWHVN6 are coupled between the global drain selection line GDSL and the drain selection line DSL, between the plurality of global word lines GWL<0> to GWL<n> and the plurality of word lines WL<0> to WL<n>, and between the global source selection line GSSL and the source selection line SSL and couples the respective lines in response to the block selection signal BLKWL. The operating voltage transmission unit 120 includes the plurality of triple well high voltage transistors TWHVN3 to TWHVN6 that enables coupling of respective lines as described above and thus can transfer a high voltage or a negative voltage from the global drain selection line GDSL, the plurality of word lines WL<0> to WL<n>, the global drain selection line GDSL, and the global source selection line GSSL to the drain selection line DSL, the plurality of word lines WL<0> to WL<n>, and the source selection line SSL of the memory cell block 200 in response to the block selection signal BLKWL.

The block selection circuit 100 according to an embodiment of this disclosure further includes the control signal generation circuit shown in FIGS. 2 to 4. The operation of the control signal generation circuit has been described above.

Figure 6:
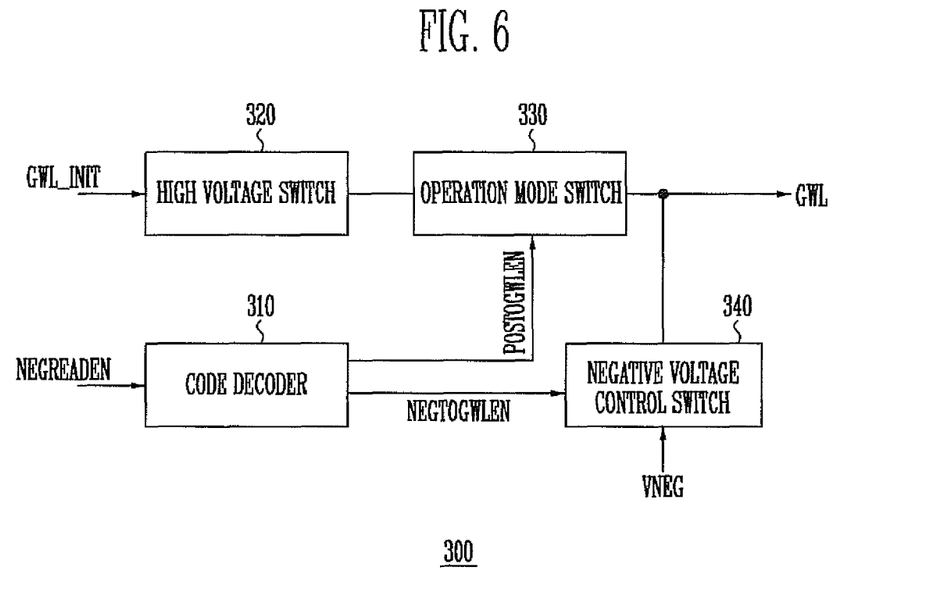
FIG. 6 is a circuit diagram of a switch circuit for a normal operation for supplying a positive voltage to a global word line and a negative voltage supply operation for supplying a negative voltage to the global word line.
Figure 7A:
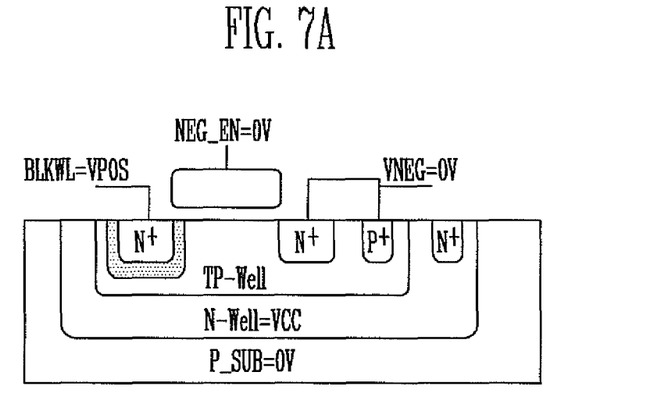
FIGS. 7A to 7D are cross-sectional views of devices where voltages are supplied to a triple well high voltage transistor.
Figure 7B:
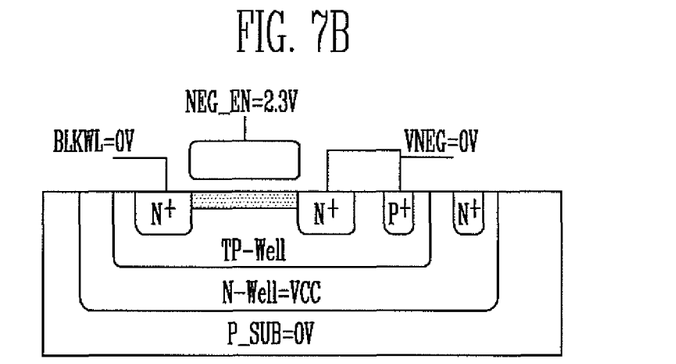
Figure 7C:
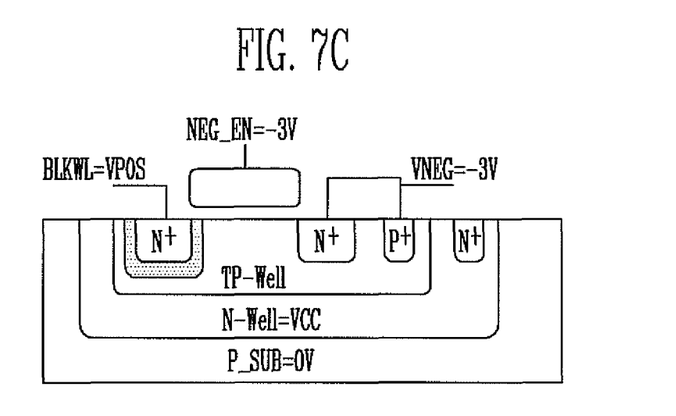
Figure 7D:
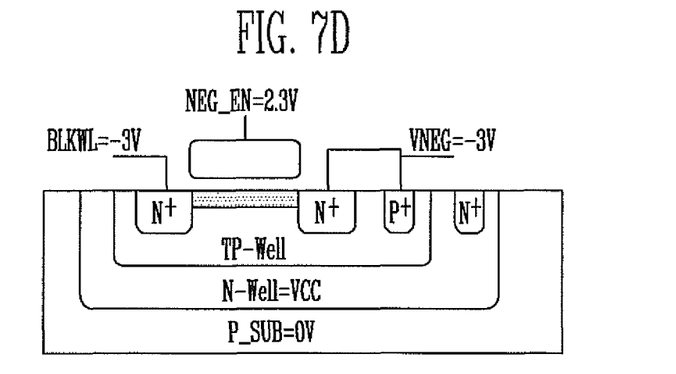

FIG. 6 is a circuit diagram of a switch circuit 300 for a normal operation for supplying a positive voltage to a global word line and a negative voltage supply operation for supplying a negative voltage to the global word line. The normal operation is performed when a program voltage is supplied to a specific memory cell block or when a verification operation or a read operation is performed for memory cells having a positive threshold voltage after memory cells are programmed to have a positive threshold voltage. The negative voltage supply operation is performed when a verification operation is performed after memory cells are programmed to have a negative threshold voltage or a read operation for memory cells having a negative threshold voltage is performed.

Referring to FIG. 6, the voltage switch circuit 300 includes a code decoder 310, a high voltage switch 320, an operation mode switch 330, and a negative voltage control switch 340.

The code decoder 310 generates a negative voltage switch enable signal NEGTOGWLEN and a high voltage switch enable signal POSTOGWLEN by decoding a negative voltage read enable signal NEGREADEN. The negative voltage read enable signal NEGREADEN is activated in the negative voltage supply operation when a read operation and a verification operation for a semiconductor memory device are performed. When one of the negative voltage switch enable signal NEGTOGWLEN and the high voltage switch enable signal POSTOGWLEN is enabled, the other one is disabled. The high voltage switch 320 receives a high voltage GWL_INIT and transfers the high voltage GWL_INIT to the operation mode switch 330. The operation mode switch 330 transfers the high voltage GWL_INIT to a global word line GWL in response to the high voltage switch enable signal POSTOGWLEN. The negative voltage control switch 340 transfers a negative voltage VNEG to the global word line GWL in response to the negative voltage switch enable signal NEGTOGWLEN. Thus, the voltage switch circuit 300 supplies the high voltage or the negative voltage to the global word line GWL in response to the negative voltage read enable signal NEGREADEN.

FIGS. 7A to 7D are cross-sectional views of devices where voltages are supplied to the triple well high voltage transistor.

The operation of the block selection circuit 100 using the voltage switch circuit 300 of this disclosure is described below with reference to FIGS. 5 to 7D.

When the high voltage is supplied to a selected memory cell block and the supply of the high voltage to unselected memory cell blocks is cut off, a voltage generator for generating the negative voltage VNEG is inactivated so that a ground voltage source VSS of 0 V is supplied instead of the negative voltage VNEG.

First, when inputted addresses match addresses of a corresponding memory cell block 200, the block address decoder 111 outputs the enable signal EN_N of a low level. Accordingly, the control signal VCON of a logic high level and the negative voltage enable signal NEG_EN of a low level are generated.

The inverter IV11 of the high voltage supply circuit 112 receives the enable signal EN_N of a low level and generates the inverse enable signal EN of a high level. The triple well high voltage transistor TWHVN1 transfers the inverse enable signal EN of a high level to output node NB in response to the control signal VCON of a high level. Thus, a potential of output node NB rises by a logic level of the inverse enable signal EN, and the depletion NMOS transistor DNMOS transfers the high voltage VPOS to the high voltage PMOS transistor HVP in response to the potential of output node NB. The high voltage PMOS transistor HVP is turned on in response to the output signal of a low level output by the inverter IV12, thus supplying the high voltage VPOS to output node NB. Accordingly, the potential of output node NB further rises. Consequently, the amount of current flowing through the depletion NMOS transistor DNMOS is further increased so that output node NB rises to the high voltage (VPOS) level.

Here, the negative voltage supply circuit 113 is disabled in response to the negative voltage enable signal NEG_EN of a low level. Thus, the triple well high voltage transistor TWHVN2 of the negative voltage supply circuit 113 is turned off while the high voltage VPOS is supplied to the source of the triple well high voltage transistor TWHVN2, the ground voltage source VSS of 0 V is supplied to the drain and P well junction thereof, and the negative voltage enable signal NEG_EN of 0 V is supplied to the gate thereof. Accordingly, output node NB outputs the block selection signal BLKWL having the high voltage (VPOS) level.

The voltage switch circuit 300 supplies the high voltage to the global word line GWL in response to the negative voltage read enable signal NEGREADEN which is disabled when the normal operation for supplying the high voltage to the global word line GWL is performed.

The operating voltage transmission unit 120 couples the global drain selection line GDSL to the drain selection line DSL of the memory cell block 200, couples the plurality of global word lines GWL<0> to GWL<n> to the plurality of word lines WL<0> to WL<n> of the memory cell block 200, and couples the global source selection line GSSL to the source selection line SSL of the memory cell block 200 in response to the block selection signal BLKWL having the high voltage (VPOS) level.

The voltage switch circuit 300 supplies the high voltage to the global word line GWL in response to the negative voltage read enable signal NEGREADEN.

Accordingly, program voltages, read voltages, and verification voltages of a positive potential, supplied through the plurality of global word lines GWL<0> to GWL<n>, can be supplied to the plurality of word lines WL<0> to WL<n>.

Next, when inputted addresses do not match addresses of a corresponding memory cell block 200, the block address decoder 111 outputs the enable signal EN_N of a high level. Accordingly, the control signal VCON of a logic low level and the negative voltage enable signal NEG_EN of a high level are generated.

The inverter IV11 of the high voltage supply circuit 112 receives the enable signal EN_N of a high level and generates the inverse enable signal EN of a low level. The triple well high voltage transistor TWHVN1 is turned off in response to the control signal VCON of a low level.

Furthermore, the negative voltage supply circuit 113 is enabled in response to the negative voltage enable signal NEG_EN of a high level, thus supplying the ground voltage source VSS of 0 V to output node NB. Here, the triple well high voltage transistor TWHVN2 of the negative voltage supply circuit 113 is turned on, where 0 V is supplied to the source of the triple well high voltage transistor TWHVN2, the ground voltage source VSS of 0 V is supplied to the drain and P well junction thereof, and the negative voltage enable signal NEG_EN of 2.3 V is supplied to the gate thereof. Accordingly, output node NB outputs the block selection signal BLKWL of a logic low level.

The operating voltage transmission unit 120 cuts off the connection of the global drain selection line GDSL to the drain selection line DSL of the memory cell block 200, the plurality of global word lines GWL<0> to GWL<n> to the plurality of word lines WL<0> to WL<n> of the memory cell block 200, and the global source selection line GSSL to the source selection line SSL of the memory cell block 200 in response to the block selection signal BLKWL of a logic low level. Accordingly, operating voltages are not supplied to the memory cell block 200.

Next, when the negative voltage is supplied to a selected memory cell block and the supply of the negative voltage to unselected memory cell blocks is cut off is described. In this case, the negative voltage VNEG is used instead of the ground voltage source VSS.

First, when inputted addresses match addresses of a corresponding memory cell block 200, the block address decoder 111 outputs the enable signal EN_N of a low level. Accordingly, the control signal VCON of a logic high level and the negative voltage enable signal NEG_EN having a negative voltage (VNEG) level are generated.

The inverter IV11 of the high voltage supply circuit 112 receives the enable signal EN_N of a low level and generates the inverse enable signal EN of a high level. The triple well high voltage transistor TWHVN1 transfers the inverse enable signal EN of a high level to output node NB in response to the control signal VCON of a high level. Accordingly, a potential of output node NB rises by a logic level of the inverse enable signal EN, and the depletion NMOS transistor DNMOS transfers the high voltage VPOS to the high voltage PMOS transistor HVP in response to the potential of output node NB. The high voltage PMOS transistor HVP is turned on in response to the output signal of a low level output by the inverter IV12, thus supplying the high voltage VPOS to output node NB. Accordingly, the potential of output node NB further rises. Consequently, the amount of current flowing through the depletion NMOS transistor DNMOS is further increased so that output node NB rises to the high voltage (VPOS) level.

Here, the negative voltage supply circuit 113 is disabled in response to the negative voltage enable signal NEG_EN having the negative voltage (VNEG) level.

Therefore, output node NB outputs the block selection signal BLKWL having the high voltage (VPOS) level.

The operating voltage transmission unit 120 couples the global drain selection line GDSL to the drain selection line DSL of the memory cell block 200, couples the plurality of global word lines GWL<0> to GWL<n> to the plurality of word lines WL<0> to WL<n> of the memory cell block 200, and couples the global source selection line GSSL to the source selection line SSL of the memory cell block 200, in response to the block selection signal BLKWL having the high voltage (VPOS) level. Accordingly, a read voltage or verification voltages of a negative voltage potential supplied through the plurality of global word lines GWL<0> to GWL<n> can be supplied to the plurality of word lines WL<0> to WL<n>.

Next, when inputted addresses do not match addresses of a corresponding memory cell block 200, the block address decoder 111 outputs the enable signal EN_N of a high level. Accordingly, the control signal VCON of the negative voltage (VNEG) level and the negative voltage enable signal NEG_EN of a high level are generated.

The inverter IV11 of the high voltage supply circuit 112 receives the enable signal EN_N of a high level and generates the inverse enable signal EN of a low level. The triple well high voltage transistor TWHVN1 is turned off in response to the control signal VCON of a low level.

Furthermore, the negative voltage supply circuit 113 is enabled in response to the negative voltage enable signal NEG_EN of a high level, thus supplying the negative voltage VNEG to output node NB. Accordingly, output node NB outputs the block selection signal BLKWL having the negative voltage (VNEG) level.

The operating voltage transmission unit 120 cuts off the connection of the global drain selection line GDSL to the drain selection line DSL of the memory cell block 200, the connection of the plurality of global word lines GWL<0> to GWL<n> to the plurality of word lines WL<0> to WL<n> of the memory cell block 200, and the connection of the global source selection line GSSL to the source selection line SSL of the memory cell block 200 in response to the block selection signal BLKWL having the negative voltage (VNEG) level. Accordingly, operating voltages are not supplied to the memory cell block 200.

Figure 8:
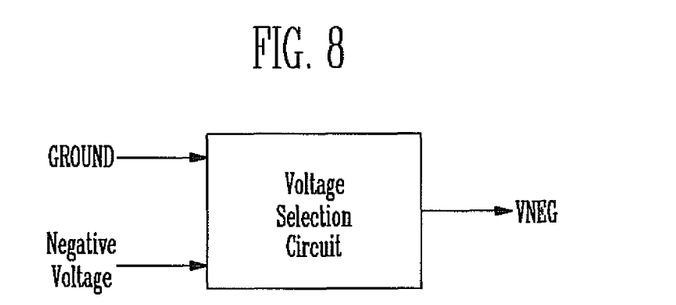
FIG. 8 illustrates a circuit for providing a negative voltage as the negative voltage VNEG for the control signal generation circuit when a transmission unit receives a negative voltage and providing a ground voltage as the negative voltage VNEG when the transmission unit receives a positive voltage.

FIG. 8 illustrates a voltage selection circuit for providing a negative voltage as the negative voltage VNEG for the control signal generation circuit 14 in FIGS. 2-4 when the transmission unit 120 in FIG. 5 receives a negative voltage and providing a ground voltage as the negative voltage VNEG when the transmission unit 120 receives a positive voltage. The voltage selection circuit may be any reasonably suitable circuit for selecting one of the negative and ground voltages based on whether the transmission unit 120 receives a positive voltage or a negative voltage. For example, the voltage selection circuit may be a multiplexer.

The block selection circuit according to an exemplary embodiment of this disclosure supplies the high voltage or the negative voltage to a selected memory cell block. Accordingly, the memory cells of the corresponding memory cell block may be programmed to have a negative threshold voltage.

The exemplary embodiments of this disclosure provides the voltage switch circuit capable of supplying a high voltage and a negative voltage by using the triple well high voltage transistor, where a nonvolatile memory device supplies the high voltage and the negative voltage to selected word lines of a memory cell block using the voltage switch circuit.

What is claimed is:

1. A voltage switch circuit having an output node, comprising:
a positive voltage supply circuit configured to supply a positive voltage to a control node;
a negative voltage supply circuit configured to supply a negative voltage to the control node in response to a negative voltage enable signal;
a control signal generation circuit configured to generate the negative voltage enable signal in response to an enable signal; and
a switch circuit configured to transfer an input voltage with a positive potential or a negative potential to the output node in response to a potential of the control node,
wherein the positive voltage supply circuit comprises a depletion transistor and a positive voltage transistor that are coupled in series between the control node and a terminal to which the positive voltage supplied.

2. The voltage switch circuit of claim 1, wherein
the depletion transistor is configured to be driven in response to the potential of the control node and the positive voltage transistor is configured to be driven in response to the enable signal.

3. The voltage switch circuit of claim 2, wherein the positive voltage supply circuit further comprises a triple well transistor for transferring an inverted signal of the enable signal to the control node.

4. The voltage switch circuit of claim 1, wherein the negative voltage supply circuit comprises a triple well transistor for supplying a negative voltage to the control node in response to the negative voltage enable signal.

5. The voltage switch circuit of claim 1, wherein the switch circuit comprises a triple well transistor for transferring the input voltage to the output node in response to the potential of the control node.

6. The voltage switch circuit of claim 1, wherein, the positive voltage supply circuit is further configured to be disabled, the negative voltage supply circuit is further configured to be enabled, and the control signal generation unit is further configured to generate the negative voltage enable signal having the negative voltage when the input voltage having the negative potential is to be transferred to the output node.

7. The voltage switch circuit of claim 1, wherein the positive voltage supply circuit is further configured to be enabled, the negative voltage supply circuit is further configured to be disabled, and the control signal generation unit is further configured to generate the negative voltage enable signal having the positive voltage when the input voltage having the positive potential is to be transferred to the output voltage.

8. The voltage switch circuit of claim 1, wherein:
the control signal generation circuit is further configured to output the negative voltage enable signal having the negative voltage when the enable signal has a logic low level, and
the control signal generation circuit is further configured to output the negative voltage enable signal having the positive voltage when the enable signal has a logic high level.

9. The voltage switch circuit of claim 3, wherein:
the control signal generation circuit is further configured to output a control signal having the positive voltage to turn on the triple well transistor when the enable signal has a logic low level,
the control signal generation circuit is further configured to output the control signal having the negative voltage to turn off the triple well transistor when the enable signal has a logic high level.

10. The voltage switch circuit of claim 3, further comprising a voltage selection circuit configured to select one of a ground voltage and the negative voltage as a selected voltage to be output from the voltage selection circuit, wherein the negative voltage supply circuit is further configured to supply the ground voltage to the control node when the voltage selection circuit selects the ground voltage.

11. The voltage switch circuit of claim 10, wherein the voltage selection circuit is further configured to make the selection based on whether the input voltage is the positive potential or the negative potential.

12. A nonvolatile memory device, comprising:
a memory cell block;
a block decoder circuit configured to output a block selection signal having a logic high with a positive voltage and having a logic low with a negative voltage and select the memory cell block in response to a block enable signal; and
an operating voltage transmission unit configured to transfer an operating voltage to the memory cell block in response to the block selection signal,
wherein the block decoder circuit comprises:
a block address decoder configured to output an enable signal in response to the block enable signal when an inputted address signal matches an address for the memory cell block;
a positive voltage supply circuit configured to supply the positive voltage to a control node in response to the enable signal;
a negative voltage supply circuit configured to supply the negative voltage to the control node in response to a negative voltage enable signal; and
a control signal generation circuit configured to generate the negative voltage enable signal in response to the enable signal,
wherein the positive voltage supply circuit comprises a depletion transistor and a positive voltage transistor coupled in series between the control node and a terminal to which the positive voltage supplied.

13. The nonvolatile memory device of claim 12, wherein the operating voltage transmission unit comprises a plurality of triple well transistors for supplying the operating voltage having a positive potential to a plurality of word lines of the memory cell block when a normal operation is to be performed and for supplying the operating voltage having a negative potential to the plurality of word lines when a negative voltage supply operation is to be performed in response to the block selection signal.

14. The nonvolatile memory device of claim 12, wherein
the depletion transistor is configured to be driven in response to a potential of the control node and the positive voltage transistor is configured to be driven in response to the enable signal.

15. The nonvolatile memory device of claim 14, wherein the positive voltage supply circuit further comprises a triple well transistor for transferring an inverted signal of the enable signal to the control node.

16. The nonvolatile memory device of claim 12, wherein the negative voltage supply circuit comprises a triple well transistor for supplying the negative voltage to the control node in response to the negative voltage enable signal.

17. The nonvolatile memory device of claim 12, wherein the positive voltage supply circuit is further configured to be disabled, the negative voltage supply circuit is further configured to be enabled, and the control signal generation unit is further configured to generate the negative voltage enable signal having the negative voltage when the operating voltage having a negative potential is to be transferred to the memory cell block.

18. The nonvolatile memory device of claim 12, wherein the positive voltage supply circuit is further configured to be enabled, the negative voltage supply circuit is further configured to be disabled, and the control signal generation unit is further configured to generate the negative voltage enable signal having the positive voltage when the operating voltage having a positive potential is to be transferred to the memory cell block.

19. The nonvolatile memory device of claim 12, wherein:
the control signal generation circuit is further configured to output the negative voltage enable signal having the negative voltage when the enable signal has a logic low level, and
the control signal generation circuit is further configured to output the negative voltage enable signal having the 1 positive voltage when the enable signal has a logic high level.

20. The nonvolatile memory device of claim 15, wherein:
the control signal generation circuit is further configured to output a control signal having the positive voltage to turn on the triple well transistor when the enable signal has a logic low level, and
the control signal generation circuit is further configured to output the control signal having the negative voltage to turn off the triple well transistor when the enable signal has a logic high level.

\* \* \* \* \*